United States Patent [19]

Gassler

[11] Patent Number: 4,581,564
[45] Date of Patent: Apr. 8, 1986

[54] MULTI-MODE HORIZONTAL DEFLECTION SYSTEM

[75] Inventor: John H. Gassler, Clearwater, Fla.

[73] Assignee: Smiths Industries, Inc., Clearwater, Fla.

[21] Appl. No.: 486,657

[22] Filed: Apr. 20, 1983

[51] Int. Cl.⁴ .................................................. H01J 29/70
[52] U.S. Cl. ..................................... 315/403; 315/367; 315/387; 315/391; 315/408; 315/409
[58] Field of Search ............... 315/364, 367, 387, 388, 315/389, 391, 396, 397, 403, 408, 409, 365, 392, 394; 364/521; 307/227, 228; 340/721, 736, 739, 745

[56] References Cited

U.S. PATENT DOCUMENTS

| | | | |
|---|---|---|---|
| 3,786,303 | 1/1974 | Hilburn | 315/397 |
| 3,816,792 | 6/1974 | Spencer, Jr. | 315/403 |
| 3,887,842 | 6/1975 | Owens, Jr. et al. | 315/397 |
| 4,288,738 | 9/1981 | Rogers et al. | 315/397 |
| 4,491,835 | 1/1985 | Aron | 315/403 |

Primary Examiner—Theodore M. Blum
Assistant Examiner—David Cain
Attorney, Agent, or Firm—Pollock, Vande Sande & Priddy

[57] ABSTRACT

A hybrid CRT display includes vector generated portions for alpha-numeric data and normal raster scan portions for symbol data. A deflection yoke for a CRT is driven by a single horizontal amplifier having switching means which operate the amplifier in three modes necessary to achieve the hybrid display, enhanced by resonant retrace during raster scanning.

10 Claims, 7 Drawing Figures

MULTI-MODE HORIZONTAL DEFLECTION SYSTEM

BACKGROUND OF THE INVENTION

The present invention relates to a deflection system for CRT displays, and more particularly to such a deflection system for a hybrid display.

BRIEF DESCRIPTION OF THE PRIOR ART

The prior art has recognized the advantages of a hybrid display utilizing vector generation for alpha-numeric symbols and normal raster scanning for geometric data. Vector generation of alpha-numeric data has the advantage of high resolution and brightness while normal raster scanning produces a high quantity of displayable information.

During raster scanning, it has long been an accepted practice to incorporate rapid or resonant retrace circuitry which returns a beam rapidly after a scan line has been completed. The retrace mode has been accomplished by the incorporation of resonant circuits in connection with a deflection yoke. A resonant retrace circuit also adds the advantage of power conservation for a CRT deflection system.

BRIEF DESCRIPTION OF THE PRESENT INVENTION

Although the prior art has incorporated raster scan, vector and resonant retrace modes in a single hybrid CRT display, they have ordinarily required that the raster and vector modes include separate power amplifiers and sweep generators for driving a deflection yoke. However, in the present invention, during the vector generation mode a single power amplifier is utilized in conjunction with novel switching circuitry thereby obviating the combined use of a deflection amplifier and a sweep generator as has previously been the practice. In a similar manner, during the raster scan mode and resonant retrace mode, the present invention utilizes the single power amplifier in lieu of a separate sweep generator and sweep amplifier.

The operational results of the novel deflection circuitry presented by the invention is a reduction in circuit components rendering the present deflection system more reliable.

The above-mentioned objects and advantages of the present invention will be more clearly understood when considered in conjunction with the accompanying drawings, in which:

DETAILED DESCRIPTION OF THE INVENTION

Figure 1A:
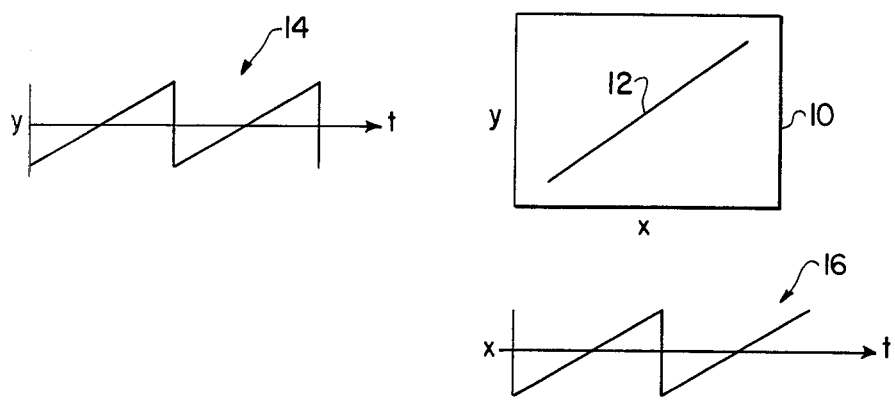
FIG. 1A is a diagrammatic view of a CRT illustrating a vector (linear) trace on the display and the xy deflection signals incident thereto.

Referring to FIG. 1A, the vector (linear) mode of operation for the present invention is illustrated by the linear trace 12 shown on a CRT display 10 as a result of the x sweep signal 16 and the y sweep signal 14, both of which are sawtooth functions.

Figure 1B:
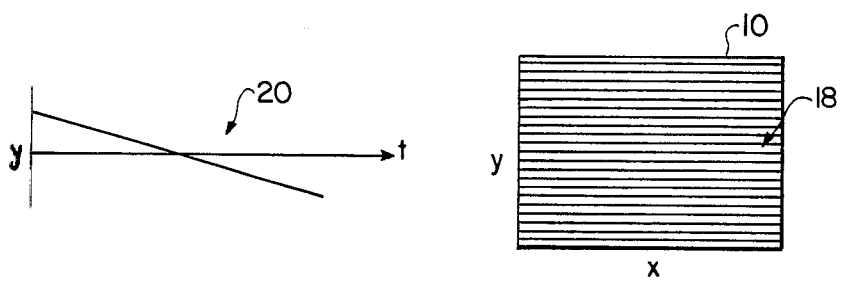
FIG. 1B is a diagrammatic view of a CRT illustrating a raster trace on the display and the xy deflection signals incident thereto.
Figure 1B:
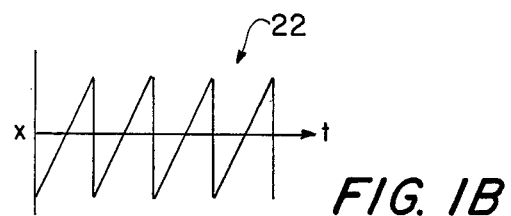

The raster mode of operation for the present invention is illustrated in FIG. 1B wherein the normal TV generated raster 18 appears on CRT display 10 as a result of the x axis horizontal sweep 22 consisting of a large number of sawtooth sweep lines as compared with the vertical sawtooth sweep signal having a lower frequency and generally indicated by reference numeral 20. Typically, the raster of FIG. 1B consists of 525 horizontal lines for each vertical sweep of the CRT display 10.

Figure 1C:
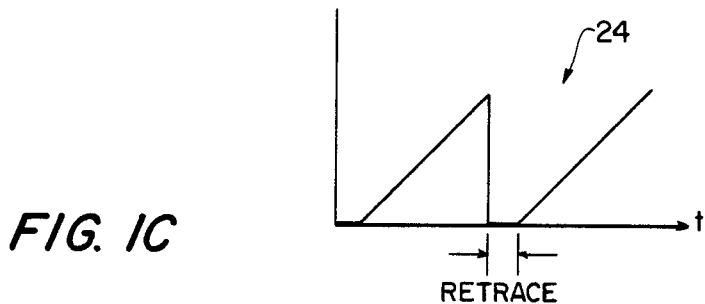
FIG. 1C is a partial timing diagram of a horizontal sweep during a resonant retrace mode of operation.

FIG. 1C is characteristic of the resonant retrace mode and shows a partial timing diagram 24. The linear rise of the waveform during a horizontal sweep is followed by a sudden fall and retrace time interval as illustrated. Normally, the sweep time for a normal display would typically be 53 microseconds and the retrace time would typically be 11 microseconds.

Figure 2:
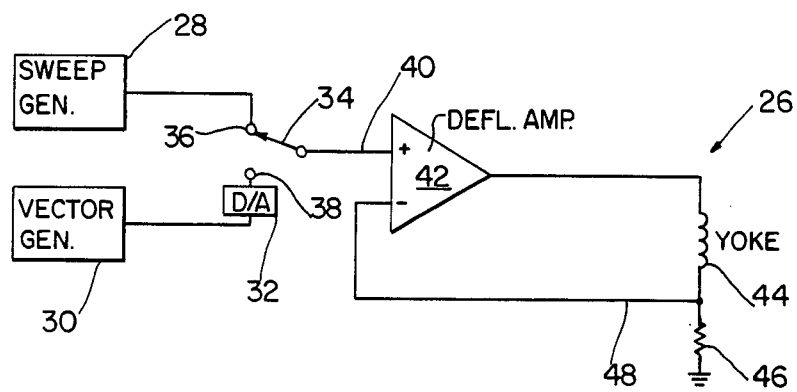
FIG. 2 is a block diagram of a prior art vector deflection subsystem.

FIG. 2 illustrates a simplified block diagram of a prior art linear deflection subsystem 26 for the x and/or y axes for a CRT display operating in a vector mode. As will be seen, the depicted subsystem includes a sweep generator 28 which generates the vertical or horizontal sweep waveforms as shown in FIG. 1A. The vector generator 30 generates the vertical and horizontal waveforms for the random vectors used to generate an alpha-numeric display and is of the type disclosed in U.S. Pat. No. 4,146,925 issued to the present assignee. The output from vector generator 30 would correspond to leads 16 or 17 of the circuitry depicted in the patent. Signals from the vector generator 30 are converted by a digital-to-analog converter 32. Switch 34 switches between the output 38 of the digital-to-analog converter 32 and the output 36 of sweep generator 28. The output 40 of switch 34 provides a first input to a conventional operational deflection amplifier 42 having its output serially connected to a CRT deflection yoke 44 that is grounded via current sensing resistor 46. A voltage is generated across resistor 46 which is fed back along lead 48 to a second (inverting) input of the deflection amplifier 42 which provides an output current which is proportional to the input voltage from either the sweep generator 28 or the vector generator 30 during switching operation of switch 34. The current through yoke 44 is a direct linear analog function of the input voltage appearing along switch output 40.

Figure 3:
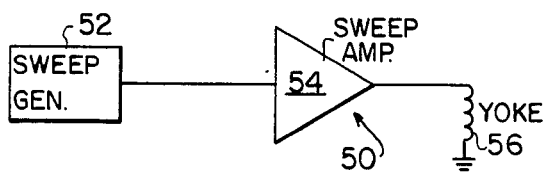
FIG. 3 is a block diagram of a prior art raster deflection subsystem.

FIG. 3 is a block diagram of a sweep deflection subsystem 50 as utilized in the prior art. It includes a sweep generator 52 which generates either vertical or horizontal sweep waveforms as explained in connection with FIG. 1B. The sweep amplifier 54 drives yoke 56 in a conventional manner for commercial TV displays.

Figure 4:
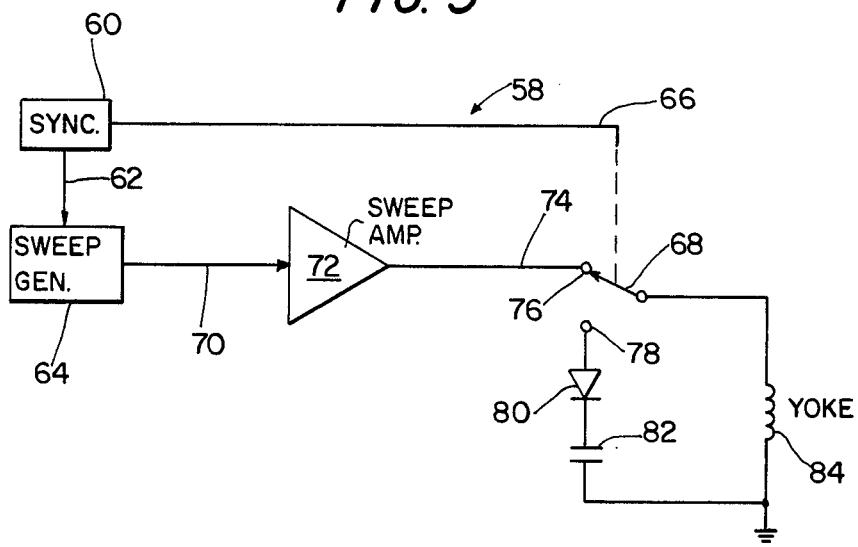
FIG. 4 is a block diagram of a prior art resonant retrace subsystem.

FIG. 4 is a simplified block diagram of a prior art resonant retrace subsystem 58 used for the x or horizontal axis in a raster display. The resonant retrace subsystem accomplishes the retrace mode as explained in connection with FIG. 1C. Briefly, the purpose of the retrace mode is to quickly return a CRT beam to its starting point at the completion of a full line sweep.

Conventional synchronization circuitry 60 synchronizes switch 68 and sweep generator 64, via lead 62. The switch contact 76 is connected to the output 70 of sweep generator 64 via sweep amplifier 72 and amplifier output lead 74. Synchronization of switch 68 occurs in a manner permitting the generator 64 to drive sweep amplifier 72 and yoke 84 during the sweep time of a horizontal deflection waveform. During a retrace time interval, switch 68 is switched to contact 78 so that yoke 84 may discharge into a resonant oscillating circuit including the serially connected diode 80 and capacitor 82. Oscillation occurs for one-half of a cycle and is prevented from continuing by diode 80 which remains forward biased during yoke discharge. After discharge, switch 68 is switched to contact 76 so that the yoke 84 may again be charged from serially connected sweep generator 64 and sweep amplifier 72. Quickly repositioning a CRT beam after a raster scan has been completed has the advantage of power conservation. This occurs due to the fact that energy stored in yoke 84 is used to return the beam to the opposite side during a retrace time interval.

Figure 5:
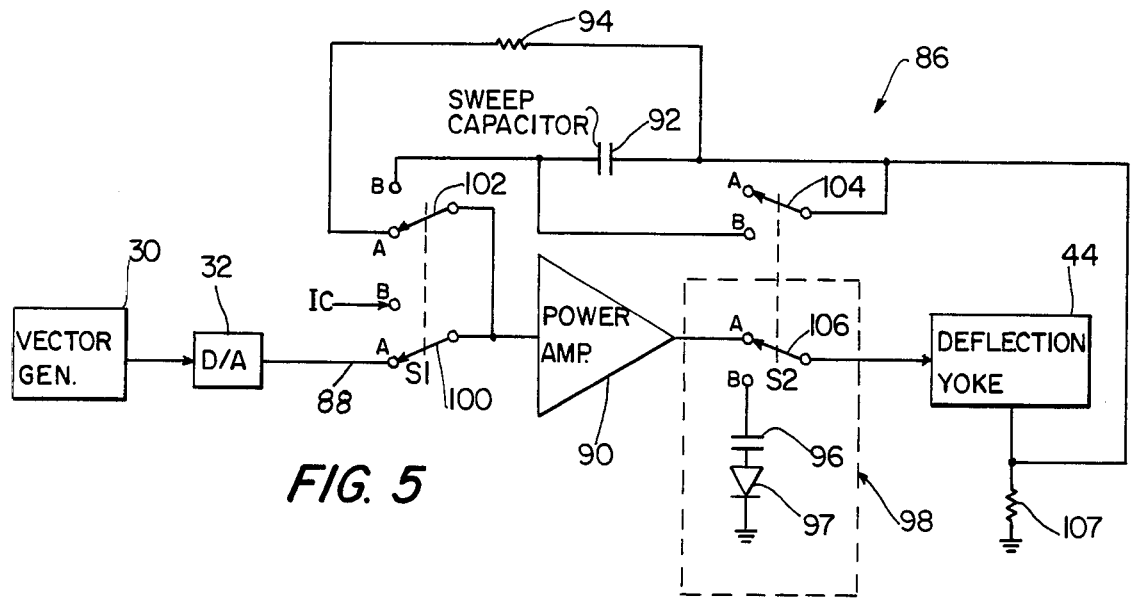
FIG. 5 is a block diagram of the present invention utilizing a single power amplifier for vector, raster and resonant retrace modes.

FIG. 5 is a block diagram of the present invention. The thrust of the circuitry 86 illustrated in FIG. 5 is that it accomplishes all three modes, previously discussed in connection with the prior art for a hybrid display, namely the linear, sweep and resonant retrace modes. Execution of these modes is accomplished by novel circuitry incorporating a switched single power amplifier. The circuitry depicted in FIG. 5 is particularly suited for x axis deflection. Simplification of the circuitry, to be discussed hereinafter, is utilized for y axis deflection.

Figure 6:
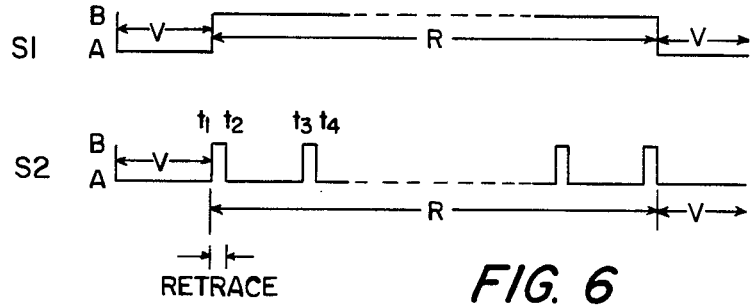
FIG. 6 is a timing diagram of the two switch means respectively connected to the input and the output of the power amplifier of FIG. 5.

Circuit operation during the linear mode will be considered first. During this mode, the output from vector generator 30, undergoing conversion through digital-to-analog converter 32, is made available along converter output line 88. During the linear mode of operation, switch S1 assumes a first switch state whereby ganged switch wipers 100 and 102 contact the "A" contacts. This will be referred to as the "A" position of the switch. FIG. 6 indicates that while switch S1 resides in the "A" position, the circuit operates in the linear mode corresponding to the vector time interval "V". During this time interval, the output from the converter 32 is fed to power amplifier 90. Switch S2 is in the position shown so that switch wipers 104 and 106 contact the "A" contacts thereby defining the "A" position for switch S2. In the "A" position of switch S2, the output from power amp 90 is fed to the deflection yoke 44 grounded through the current sensing resistor 107. The linear feedback voltage is fed back from the resistor 107 to the "A" contact of switch S1, via linear feedback resistor 94. In the "A" position of switch S1, the input of the power amplifier 90 receives not only the signal along output line 88 but also the linear feedback signal developed across resistor 94. Thus, the deflection yoke current will be directly proportional to the input voltage to power amplifier 90. The linear mode, during which time the vector time interval occurs is depicted in FIG. 6 during the time preceding $t_1$ and labeled "V".

When a vector display has been completed during the linear mode, switch S1 is switched to the "B" position in the same manner as switch S2 is moved to a "B" position. This initiates the raster mode of operation. As will be seen from FIG. 6, switch S1 remains in the "B" position during the entire raster mode labeled "R". When switch S1 is in the "B" position, an initial input IC is contacted by switch wiper 100 and delivered to power amplifier 90. Simultaneously, the deflection yoke 44 is connected to the capacitor 96 through switch wiper 106 to complete an oscillating resonant circuit for quickly discharging the yoke thereby defining a resonant retrace mode beginning at time $t_1$ (FIG. 6). Diode 97, serially connected with capacitor 96 ensures that only a half-cycle of oscillation will occur terminating at time $t_2$ (FIG. 6). Sweep capacitor 92 becomes initially discharged due to the shorting connection of switch wiper 104.

At the termination of $t_2$ (FIG. 6), switch S2 is returned to the "A" position while switch S1 remains unswitched in the "B" position. Between times $t_2$ and $t_3$ (FIG. 6) wiper 102 of switch S1 completes the feedback circuit to the input of power amplifier 90, via sweep capacitor 92. During the sweep mode the deflection current will be directly proportional to the feedback voltage delivered through sweep capacitor 92. Power amplifier 90, with the sweep capacitor in the feedback circuit then acts as an integrating amplifier and integrates the current through the deflection yoke thus causing the electron beam of a CRT to be swept from the left side of the CRT to the right side of the CRT.

As soon as the sweep has reached the rightmost side of a CRT, switch S2 is returned to the "B" position which occurs at time $t_3$ (FIG. 6). In this position, the sweep capacitor 92 is again shorted and the capacitor's charge is returned to zero thus allowing the integration process to begin again after the retrace interval defined between $t_3$ and $t_4$ (FIG. 6). During the retrace period defined between $t_3$ and $t_4$, wiper 106 of switch S2 is in the "B" position causing rapid discharge of the deflection yoke 44 through capacitor 96 and diode 97 generating an oscillatory half cycle as previously discussed. After $t_4$, switch S2 returns to the "A" position whereby sweep capacitor 92 again introduces an integrating voltage to power amplifier 90 followed by increasing current flow through the deflection yoke 44 until a subsequent resonant retrace interval.

Thus far, FIG. 5 has been explained in connection with x axis deflection wherein the resonant retrace circuitry is used to return the beam in a very short period of time from one side of a CRT to the opposite side.

In a y axis or vertical deflection system, similar circuitry can be used as shown in FIG. 5 with the exception of the retrace components indicated in the dotted block 98 including capacitor 96 and diode 97 as well as wiper 106 of switch S2. Since rapid retraces are not necessary for the vertical or y axis, the deflection yoke 44 may be directly connected to the output of power amplifier 90. Switch S1 may then be operated as previously described and wiper 104 of switch S2 would continue to operate during the raster mode as previously described.

It should be understood that although the switches S1 and S2 have been shown and described as mechanical devices, conventional solid state switches may be employed with equivalent results.

Figure 7:
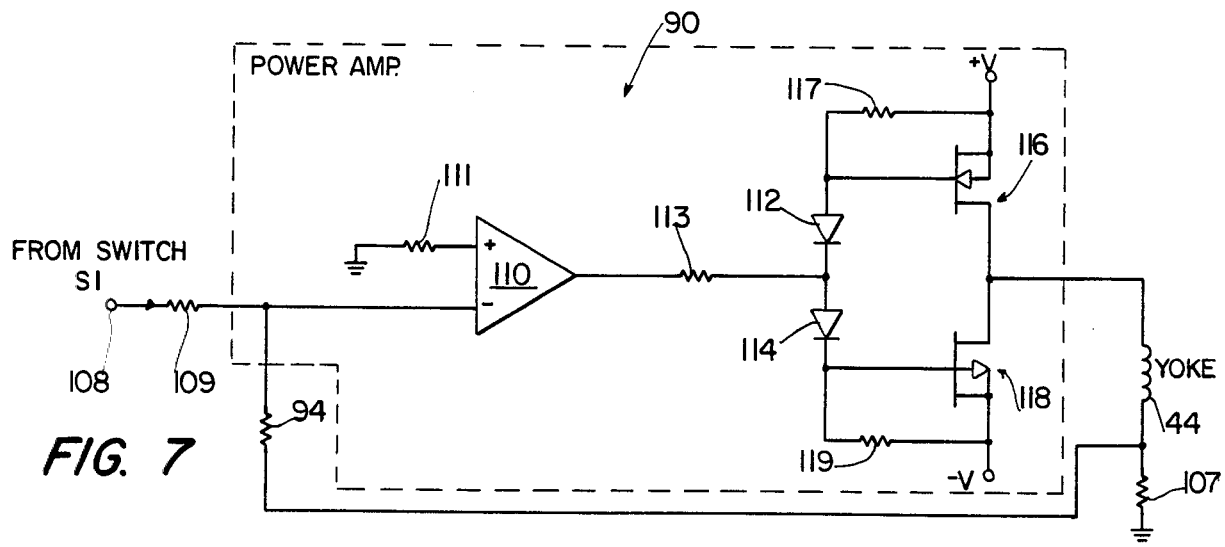
FIG. 7 is a schematic diagram of a power amplifier as input in the present invention.

FIG. 7 is a detailed schematic of a typical power amplifier as generally indicated by reference numeral 90 in FIG. 5. It includes an operational amplifier 110 having a first input connected to ground through a resistor 111. The second input to the amplifier is connected to an input terminal 108 through a series connected resistor 109. As connected, the operational amplifier 110 is an inverting circuit. Bias diodes 112 and 114 are connected to the output of the amplifier 110 through series connected resistor 113. The diodes bias the output power drive solid state components 116 and 118 connected to the diodes 112 and 114, respectively, in a conventional manner through parallel resistors 117 and 119. Typically, the solid state components 116 and 118 may be MOSFETS which provide the current power drive to yoke 44. As previously discussed, resistor 107 is serially connected with the yoke 44 and provides a feedback signal to the input of the operational amplifier 110. The feedback input voltage is proportional to the current through the yoke 44. The feedback input to the operational amplifier 110 is added to the input voltage through resistors 109 and 94. In the raster mode of operation, resistor 94 is replaced with a capacitor 92, as shown in FIG. 5. It may be preferable that bipolar power transistors (not shown) be used in lieu of the MOSFETS 116 and 118. The necessary modifications to achieve this would be obvious to one of ordinary skill in the art.

In accordance with the preceding description, it will be appreciated that the present invention as specified by FIG. 5 enables a hybrid CRT display incorporating the three modes, namely vector, raster and resonant retrace by utilizing a novel switched single power amplifier circuit.

It should be understood that the invention is not limited to the exact details of construction shown and described herein for obvious modifications will occur to persons skilled in the art.

I claim:

1. A multi-mode deflection system for a CRT, the system operating in vector or linear, raster and rapid discharge modes, the system comprising:
   power amplifying means;
   first switching means having its output connected to the power amplifying means, the switching means assuming two states;
   means providing vector data to the input of the switching means during a first state corresponding to a vector mode of the system;
   second switching means having its output connected to a CRT deflection yoke, the second switching means assuming two states, the first of which occurs during the first state of the first switching means and during which the second switching means connects the output of the power amplifying means to the deflection yoke;
   means connected in circuit with the second switching means during the second state thereof for rapidly discharging the yoke during a relatively short interval resulting in rapid retrace of a CRT beam after which the second switching means returns to the first state;
   feedback means connected between the deflection yoke and the input of the first switching means for providing yoke current from the power amplifier thereby generating a deflection signal for a CRT beam.

2. The subject matter set forth in claim 1 wherein the means providing vector data comprises digital vector generating means and digital-to-analog converting means connected to the output of the vector generating means for furnishing the input of the first switching means with an analog signal of the vector data.

3. The subject matter set forth in claim 1 wherein the discharging means comprises capacitive means connectable through the second switching means to the yoke for forming a resonant circuit.

4. The subject matter set forth in claim 3 including diode means connected to the capacitive means for ensuring a half cycle of operation during the discharge mode.

5. The subject matter set forth in claim 1 wherein the feedback means comprises linear feedback resistive means connected between the yoke and the input of the first switching means when the latter is in the first switching state for providing a signal to the input of a power amplifying means which is directly proportional to yoke current during a vector mode.

6. The subject matter set forth in claim 1 together with capacitive means connected between the yoke and the input of the first switching means when the latter is in the second switching state for providing a sweep signal to the input of the power amplifying means during a raster mode.

7. A multi-mode deflection system for a CRT, the system operating in vector, raster and rapid discharge modes, the system comprising:
   single power amplifying means;
   means for generating vector data;
   means for connecting the vector data generating means to the input of the power amplifying means during a vector mode of operation;
   a deflection yoke;
   means for connecting the output of the power amplifying means to the yoke during a vector mode;
   feedback means connected between the yoke and the input of the power amplifying means for providing the amplifying means with an input signal, during the vector mode, which is proportional to current in the yoke;
   means connected between the yoke and the input of the power amplifying means during a raster mode for providing the power amplifying means with a linearly increasing signal which is received by the deflection yoke for causing a beam to sweep across a predetermined axis of a CRT;
   means switchably connected across the deflection yoke for rapidly discharging the yoke during a retrace mode during which a CRT beam is quickly returned across the face of the CRT.

8. The subject matter set forth in claim 7 wherein the discharging means comprises capacitive means connected across the yoke for completing a resonant discharge circuit.

9. The subject matter set forth in claim 8 together with a diode serially connected to the capacitive means for limiting the discharge to one half an oscillating cycle.

10. The subject matter set forth in claim 9 wherein the vector data generating means comprises a digital vector generator and digital-to-analog means for converting the data from the generator to analog form.

* * * * *